United States Patent
Gataric

(10) Patent No.: US 11,519,745 B1
(45) Date of Patent: *Dec. 6, 2022

(54) METHODS AND APPARATUS TO COMPRESS TELEMATICS DATA

(71) Applicant: STATE FARM MUTUAL AUTOMOBILE INSURANCE COMPANY, Bloomington, IL (US)

(72) Inventor: Alexander Gataric, Normal, IL (US)

(73) Assignee: STATE FARM MUTUAL AUTOMOBILE INSURANCE COMPANY, Bloomington, IL (US)

( * ) Notice: Subject to any disclaimer, the term of this patent is extended or adjusted under 35 U.S.C. 154(b) by 149 days.

This patent is subject to a terminal disclaimer.

(21) Appl. No.: 17/022,788

(22) Filed: Sep. 16, 2020

Related U.S. Application Data

(63) Continuation-in-part of application No. 16/379,453, filed on Apr. 9, 2019, now Pat. No. 11,372,902.

(51) Int. Cl.
| | | |
|---|---|---|
| *G01C 21/36* | (2006.01) | |
| *G01C 21/34* | (2006.01) | |
| *G06F 16/29* | (2019.01) | |

(52) U.S. Cl.
CPC ..... *G01C 21/3617* (2013.01); *G01C 21/3461* (2013.01); *G01C 21/3492* (2013.01); *G01C 21/367* (2013.01); *G06F 16/29* (2019.01)

(58) Field of Classification Search
None
See application file for complete search history.

(56) References Cited

U.S. PATENT DOCUMENTS

| | | | |
|---|---|---|---|
| 9,311,271 B2 | 4/2016 | Wright | |
| 9,633,487 B2 | 4/2017 | Wright | |
| 10,192,369 B2 | 1/2019 | Wright | |
| 10,198,879 B2 | 2/2019 | Wright | |
| 10,832,449 B1 | 11/2020 | Russo et al. | |
| 2015/0285656 A1* | 10/2015 | Verheyen | G01C 21/32 |
| | | | 701/428 |
| 2016/0086285 A1* | 3/2016 | Jordan Peters | G08G 1/096827 |
| | | | 701/484 |
| 2016/0379486 A1 | 12/2016 | Taylor | |
| 2017/0124411 A1 | 5/2017 | Lee et al. | |
| 2019/0161190 A1* | 5/2019 | Gil | B65G 1/0435 |
| 2020/0317216 A1 | 10/2020 | Konrardy et al. | |

OTHER PUBLICATIONS

Graser, A.; "Movement data in GIS #25: moving object databases"; https://anitagraser.com/2019/11/16/movement-data-in-gis-25-moving-object-databases/; published Nov. 16, 2019; p. 1-3.

* cited by examiner

*Primary Examiner* — Kris E Mackes
*Assistant Examiner* — Soheila (Gina) Davanlou
(74) *Attorney, Agent, or Firm* — Marshall, Gerstein & Borun LLP

(57) ABSTRACT

Example methods, apparatus, and articles of manufacture to capture and compress telematics data are disclosed herein. An example computer-implemented method, executed by a processor, to represent telematics data includes identifying, with the processor, a physical intersection of roads, identifying, with the processor, virtual lines crossing the roads, assigning, with the processor, ordinals to the virtual lines, representing, with the processor, a physical traversal through the physical intersection captured in first telematics data by a pair of the ordinals, and storing the pair of the ordinals in second compressed telematics data.

20 Claims, 8 Drawing Sheets

METHODS AND APPARATUS TO COMPRESS TELEMATICS DATA

CROSS-REFERENCE TO RELATED APPLICATIONS

This application is a continuation-in-part of U.S. patent application Ser. No. 16/379,453, entitled "METHODS AND APPARATUS TO COMPRESS TELEMATICS DATA," and filed Apr. 9, 2019, the disclosure of which is hereby expressly incorporated by reference herein in its entirety.

FIELD OF THE DISCLOSURE

This disclosure relates generally to telematics, and, more particularly, to compressing telematics data.

BACKGROUND

Telematics is a method of monitoring a vehicle. By combining a location determination system (e.g., the global positioning system (GPS)) data with on-board monitoring data it's possible to record and map where a car is, how fast it's traveling or a rate of acceleration, how it is being driven (e.g., directly, based on indications of driver operation such as application of brake or gas pedals, or indirectly, e.g., high acceleration values may correlate to poor driving behavior), and, in some examples, cross reference that information with how a car is operating internally.

Working with both time and spatial driving data can be a challenge for telematics. In particular, most spatial software does not natively process temporal data, leading to difficulties in working with driving data in which a car crosses an intersection more than once in a trip.

Figure 1:
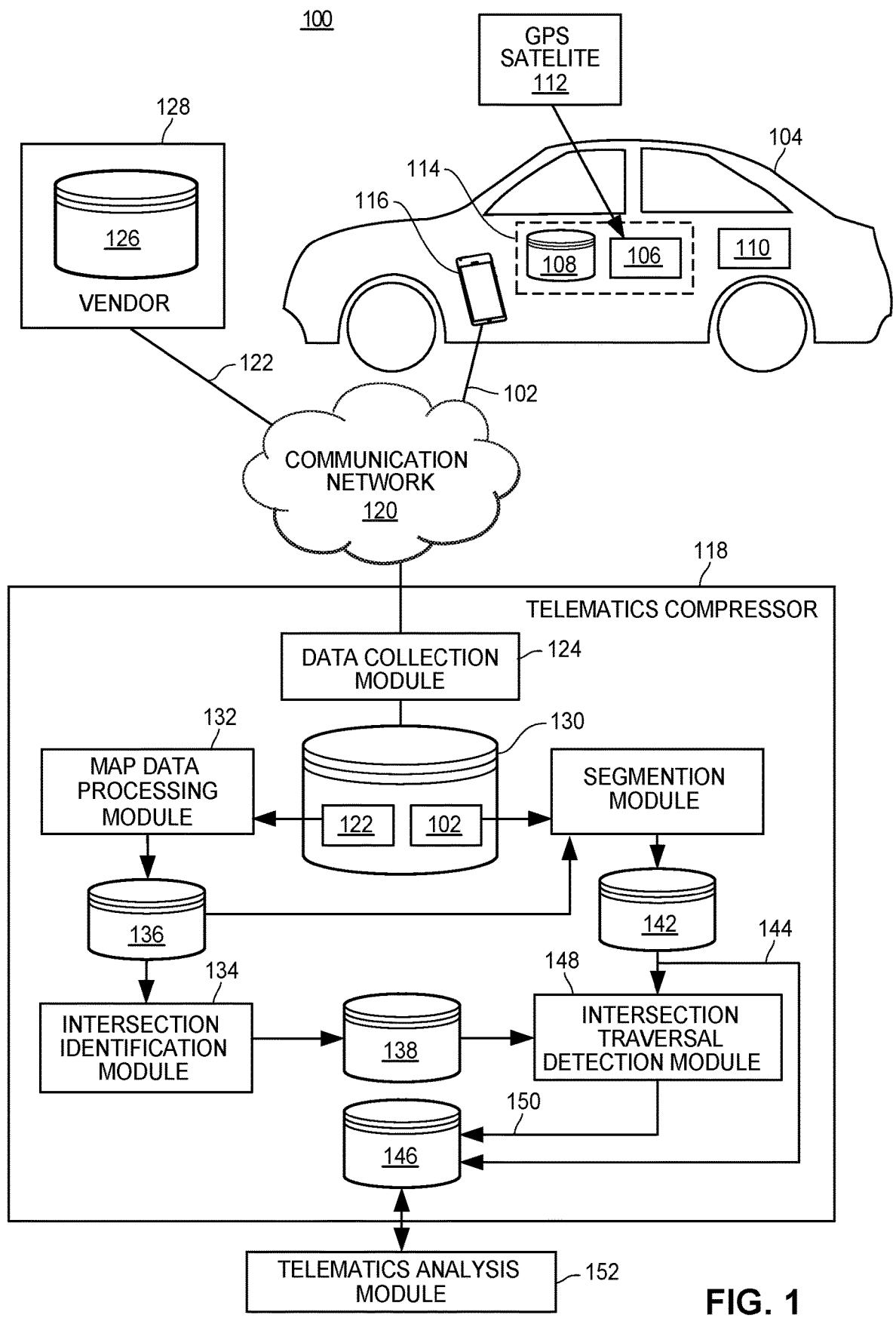
FIG. 1 is a block diagram of an example system to capture and compress telematics data, in accordance with teachings of this disclosure.

The figures depict embodiments of this disclosure for purposes of illustration only. One skilled in the art will readily recognize from the following discussion that alternate embodiments of the structures and methods illustrated herein may be employed without departing from the principles set forth herein.

In general, the same reference numbers will be used throughout the drawing(s) and accompanying written description to refer to the same or like parts. The figures are not to scale. Connecting lines or connectors shown in the various figures presented are intended to represent example functional relationships and/or physical or logical couplings between the various elements.

DETAILED DESCRIPTION

Telematics can generate large amounts of data. For example, geospatial driving data (e.g., longitude, latitude, time, date, etc.) may be collected up to 15 times per second. The amount of data is compounded by the large number of vehicles on the road, the large number of roads and intersections, etc. Because of the vast amounts of data, conventional analytic methods can consider only a small number of roads and intersections at a time, thus, limiting their usefulness. Moreover, the vast amounts of conventional telematics data can require large amounts of machine- or computer-readable storage. In contrast, the methods and apparatus disclosed herein enable geospatial data to be represented using far less data (e.g., be compressed), and to be represented in a way that allows for efficient retrieval and analysis. Accordingly, all the roads and intersections of, for example, an entire city, can be analyzed at the same time. For readability, references will be made herein to roads. However, teachings of this disclosure apply to other surfaces on which a vehicle may travel, such as streets, lanes, dirt roads, highways, expressways, alleys, boulevards, parkways, access roads, ramps, etc.

Additionally, the methods and apparatus discussed herein enable vastly more efficient determination of when intersections are crossed, as well as the direction of each intersection crossing, by directly combining temporal telematics data with spatial telematics data to form simplified straight-line segments and comparing these simplified straight-line segments to spatial intersection data to determine which intersections are crossed by which drivers, the time range of each intersection crossing, and the direction taken in the intersection during each intersection crossing. In particular, determining details about an intersection crossing using a simplified straight-line segment that generally represents a driver's motion through an intersection requires only a small number of data points to be processed and analyzed, while making this determination using a line mapping the driver's exact motion (which may curve, or zig-zag, or otherwise not form an exactly straight line) requires the processing and analysis of thousands (or hundreds of thousands) of data points. Accordingly, when using a computer to determine which intersections are crossed at which times (and the direction of each intersection crossing) using simplified straight-line segments comprising a small number of points, as discussed herein, the processing time and power required for this determination is greatly reduced compared to making this determination using a large number of data points representative of the driver's exact motion.

Reference will now be made in detail to non-limiting examples, some of which are illustrated in the accompanying drawings.

FIG. 1 is a block diagram of an example telematics system 100 to capture and compress telematics data 102. In the example of FIG. 1, the telematics data 102 is captured for (e.g., by, etc.) a vehicle 104. However, telematics data may be captured for (e.g., by, etc.) a plurality of vehicles of any types.

To capture the telematics data 102 (e.g., geo-spatial data, etc.), the vehicle 104 includes a GPS receiver 106, a non-transitory computer- or machine-readable storage medium or disk 108, and, in some examples, a sensor network 110. The GPS receiver 106 may be a portion of a memory unit (e.g., a program memory 802 of FIG. 8) configured to store software, and machine- or computer-readable instructions that, when executed by a processing unit (e.g., a processor 804 of FIG. 8), cause the vehicle 104 to receive radio signals from one or more GPS satellites, one of which is shown and designated at reference numeral 112, and determine locations of the vehicle 104 on the Earth's surface based on the received radio signals. In some examples, trilateration is used to determine locations. The GPS receiver 106 stores determined locations and associated dates and times in the non-transitory computer- or machine-readable storage medium or disk 108 using any number or types of data structures. While the example of FIG. 1 uses a GPS receiver 106 and GPS satellites 112 to determine locations, other terrestrial, satellite, over-the-air, wireless, etc. technologies may be used. Further, in some examples, raw radio signals are stored in the non-transitory computer- or machine-readable storage medium or disk 108 for subsequent processing.

As used herein, a non-transitory computer- or machine-readable storage medium or disk may be, but is not limited to, one or more of a hard disk drive (HDD), an optical storage drive, a solid-state storage device, a solid-state drive (SSD), a read-only memory (ROM), a random-access memory (RAM), a compact disc (CD), a compact disc read-only memory (CD-ROM), a digital versatile disk (DVD), a Blu-ray disk, a cache, a flash memory, or any other storage device or storage disk in which information may be stored for any duration (e.g., permanently, for an extended time period, for a brief instance, for temporarily buffering, for caching of the information, etc.).

In some examples, the vehicle 104 includes the sensor network 110 having any number or types of sensors, measurement devices, computing devices, etc. to capture data representing other aspects of the vehicle 104 or a person operating the vehicle. For example, the sensor network 110 can capture data representing how fast the vehicle 104 is traveling, how erratically the vehicle 104 is being operated, diagnostic information, etc.

The GPS receiver 106 and the non-transitory computer- or machine-readable storage medium or disk 108, and, in some examples, the sensor network 110, may be implemented by a device 114 that a person simply places in the vehicle 104 (e.g., in a glove compartment, etc.). Some devices 114 may also be mechanically or electrically coupled to the vehicle 104, may be assembled to the vehicle 104 during manufacture, etc. In some examples, the device 114 uses a person's mobile device 116 (e.g., smartphone, tablet, smartwatch, etc.) that is coupled to the device 114 to communicate the telematics data 102 from the non-transitory computer- or machine-readable storage medium or disk 108 to a telematics compressor 118 via one or more communication networks 120. Additionally, and/or alternatively, the telematics data 102 may be communicated to the telematics compressor 118 when the device 114 is, for example, communicatively coupled to a computer. The telematics data 102 may be communicated periodically, aperiodically, in real-time as the telematics data 102 is collected (e.g., as the vehicle 104 is running or being operated), in batch, etc.

Example communication networks 120 include the Internet, a local area network (LAN), a metropolitan area network (MAN), a wide area network (WAN), a mobile, a wired network, a Wi-Fi® network, a cellular network, a wireless network, a private network, a virtual private network, etc.

To access (e.g., obtain, query for, collect, receive, etc.) the telematics data 102 and map data 122, the example telematics compressor 118 includes a data collection module 124. The data collection module 124 obtains the map data 122 from a map database 126 managed by a vendor 128 of map data. The data collection module 124 obtains the telematics data 102 and map data 122 using any number or types of methods, protocols, messages, etc., and stores the obtained telematics data 102 and map data 122 in a database 130 using any number or types of data structures. In some examples, rather than storing the map data 122 in the database 130 it is accessed from the map database 126 as needed.

To process the map data 122, the telematics compressor 118 includes a map data processing module 132, and may include an intersection identification module 134 in some examples. The map data processing module 132 may be a portion of a memory unit (e.g., the program memory 802 of FIG. 8) configured to store software, and machine- or computer-readable instructions that, when executed by a processing unit (e.g., the processor 804 of FIG. 8), cause the map data processing module 132 to process the roads in the map data 122 to remove unneeded roads (e.g., parking lots), and to add orientation information to roads (e.g., road running from 180 degrees (West) to 45 degrees (North-East) to form road data 136.

The intersection identification module 134 may be a portion of a memory unit (e.g., the program memory 802 of FIG. 8) configured to store software, and machine- or computer-readable instructions that, when executed by a processing unit (e.g., the processor 804 of FIG. 8), cause the intersection identification module 134 to identify physical intersections of the roads specified in the map database 126 based on the roads defined in the road data 136, and combine nearby intersections (e.g., two nearby intersections that form a dog leg intersection). In an example implemented using PostGIS, the ST_INTERSECTION function is used to identify intersections, and the ST_CLUSTERDBSCAN function is used to identify nearby intersections. In some examples, the map database 126 includes information regarding intersections. In such examples, the intersection identification module 134 need not identify intersections. Additionally or alternatively, the intersection identification module 134 may enhance intersection data with custom values such as risk classifications or crash counts derived, for example, by an operator or owner of the telematics compressor 118.

Figure 2A:
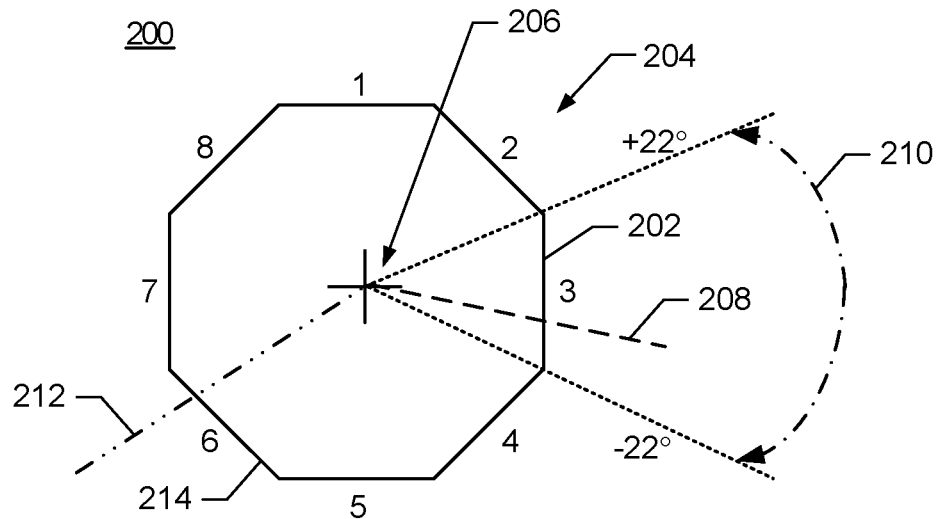
FIG. 2A is a diagram of an example set of ordinals that can be used to represent and compress telematics data associated with traversals through intersections.

The intersection identification module 134 identifies, for each (combined) intersection, a plurality of virtual lines angularly spaced about (e.g., around, encircling, etc.) the intersection. Virtual lines that do not cross a road are removed. FIG. 2A illustrates an example set 200 of eight virtual lines, one of which is designated at reference numeral 202, defined and angularly spaced to form an octagonal shape 204 about an intersection 206. The virtual lines 202 are selected to be perpendicular to the roads entering and exiting the intersection 206. Thus, the set of virtual lines for an intersection may form a rotated variant of the octagonal shape 204 of FIG. 2A. Each of the virtual lines 202 is associated with a range of directions from which a road enters or exits the intersection 206. In the example of FIG. 2A, each virtual line is associated with 360°/8=45 degrees. Thus, for example, a road 208 entering or exiting the intersection 206 at an angle 210 between −22° and +22° will intersect the virtual line 202. In some examples, the virtual lines are identified to satisfy a criteria, for example, be a predefined distance from the physical intersection.

In an example implemented using PostGIS, the virtual lines 202 for each intersection 206 are created by generating a circle (of line type) of fixed radius from the road intersection point 206 that intersects the road line segments 208, 212. To create the circle line, the ST_EXTERIORRING function converts the solid circle shape created by the ST_BUFFER function into a circular line. The ST_BUFFER function uses the road intersection point 206 with a buffer parameter of 80 feet. The intersection of the circle and a road 208, 212 is the midpoint of the virtual line 202. The circle-road intersection points are determined by using the ST_INTERSECTION function on the line circle and road segment definitions. The virtual line 202 is perpendicular to the road line segment 208, 212 at the point of intersection of the road line with the circle. The ST_OFFSETCURVE function is used to create two points perpendicular to angle of the road 208, 212 at the intersection of the road segment and line circle. The ST_MAKELINE function creates the virtual line 202 by using the points created by ST_OFFSETCURVE as the start and endpoints of the line. The buffer of 80 feet was found to work for most intersections. Other lengths, including lengths that depend on intersection type, could be used. In the illustrated example, the virtual lines are defined to be 55 feet in length, or 91 feet for divided intersections. Other lengths, including lengths that depend on intersection type, could be used. Moreover, in some examples, the length of vector lines may be reduced, e.g., in cases in which the vector lines overlap due to roads being angled and close to each other, so that the vector lines end at the point of intersection.

Figure 2B:
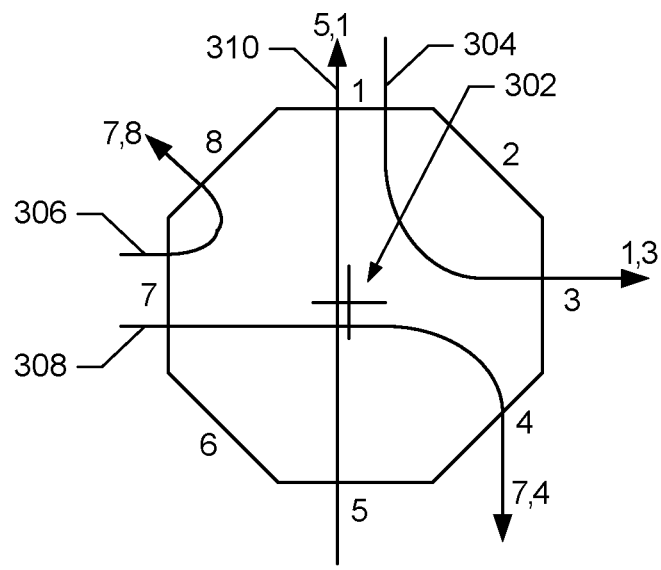
FIG. 2B is a diagram of example representations of traversals through an intersection.

The intersection identification module 134 assigns to each virtual line 202 an associated ordinal number that uniquely identifies the virtual lines of an intersection. For example, in FIG. 2A the virtual line 202 is assigned the ordinal 3. Additionally or alternatively, ordinals that uniquely identify virtual lines across multiple intersections can be assigned. Thus, for example, the road 208 entering or exiting the intersection 206 will be associated with the ordinal 3. Another road 212 that exits or enters the intersection 206 intersects another virtual line (e.g., a virtual line 214) and is associated with its ordinal (e.g., ordinal 6). By determining which virtual lines 202 are crossed when a physical (e.g., actual, etc.) traversal through the physical intersection 206 is made (e.g., from road 208 onto road 212), the traversal can be represented by a simple pair of ordinals (e.g., a pair of ordinals (3, 6)). In some examples, the first ordinal in a pair of ordinals represents the entry into the intersection, and the second ordinal in a pair of ordinals represents the exit from the intersection Additional example traversals through an intersection 302 are shown in FIG. 2B. A first traversal 304 can be represented by a pair of ordinals (1, 3), a second traversal 306 can be represented by a pair of ordinals (7, 8), a third traversal 308 can be represented by a pair of ordinals (7, 4), and a fourth traversal 310 can be represented by a pair of ordinals (5, 1). Because a pair of ordinals can be represented by far less data than a sequence of telematics location data it represents simplified (e.g., compressed, etc.) representation of intersection traversal telematics data. Moreover, the use of virtual lines and ordinals represents a significant compression of intersection traversal location data. Moreover, traversals through intersections can be identified in response to a request to perform a simple search based on ordinals.

In some examples, the road data 136 includes speed limit information that can be used to determine whether a vehicle turned from a side street or parking lot onto a busy street, or vice versa. Such speed limit information may be useful in determining driving behavior for different types of intersections. Speed limit ordinals could be included as another ordinal value per virtual line 214. Additional, or alternatively, ordinal values can be assigned for other road characteristics such as stop signs, stop lights, etc. These additional intersection ordinal value pairs and turn direction ordinal values can be analyzed individually or together on a city wide scale as described for turn direction ordinal values. For example, a trip through an intersection can have directional pair of ordinals (3, 1), and a road speed pair of ordinals (8, 6) indicating a right turn from a side street to a busy street.

Returning to FIG. 1, the intersection identification module 134 stores intersection data 138 (e.g., information, etc.) representing the identified (combined) intersections, their virtual lines, and the ordinals assigned to the virtual lines for subsequent recall. In some examples, the intersection data 138 includes the time the vehicle spent in on any of the simplified segments that intersect the intersection (e.g., the simplified segments that are within 182 feet of the intersection, or within another set distance range of the intersection). The intersection data 138 may be stored using any number or types of data structures, on any non-transitory computer- or machine-readable storage medium or disk.

To segment the telematics data 102, the telematics compressor 118 includes a segmentation module 140. The segmentation module 140 may be a portion of a memory unit (e.g., the program memory 802 of FIG. 8) configured to store software, and machine- or computer-readable instructions that, when executed by a processing unit (e.g., the processor 804 of FIG. 8), cause the segmentation module 140 to segment the telematics data 102 into travel segments data 142 (e.g., based on straight lines) that allow for a travel path to be represented with less data. In an example implemented using PostGIS, the ST_SIMPLIFY function is used to segment the telematics data 102 into the travel segments data 142.

The segmentation module 140 compares the travel segments data 142 with the road data 136 to identify which road segments were traversed using the ST_DISTANCE function to find the road segment that is closest to points of the telematics data 102 (or ST_DWITHIN to find roads within a certain distance). The segmentation module 140 converts raw latitude, longitude, and time data into a PostGIS point data type using the ST_MAKEPOINTM function, with the latitude and longitude being the X and Y coordinates, respectively, and the M coordinate being the time converted into UNIX epoch time (the number of seconds since Jan. 1, 1970). The ST_MAKELINE function is used to create a line from the telematics data 102 using the M coordinate value of the timestamps of the telematics data 102, with the points ordered by UNIX epoch time. The ST_SIMPLIFY function converts this line into a simplified line using an implementation of the Douglas-Peuker algorithm with a tolerance of 0.00005.

The simplified line is divided into segments using the ST_POINTN function for each point in the simplified line. The M coordinates are used as the start and end range of each segment which is joined to the telematics data 102 in the segmentation module 140. That is, the segmentation module 140 divides the simplified line into individual line segments with the UNIX time range defined as a range from the value of the M coordinate of the beginning of the segment to the value of the M coordinate of the end of the segment. The linear range of the line is defined as the start and end point of the segment in proportion to the overall length of the simplified line, with "0" defined as the start of the simplified line and "1" defined as the end of the simplified line. For example, a linear range of a segment that starts at 0.1 and ends at 0.2 on a simplified line with a length of 10 corresponds to a position of "1" and "2" on the length of the line. The linear range is calculated with the start of the range being the sum of the linear fraction of previous segments minus the length of the current segment, and the end of the range being the sum of the linear fraction of previous segments. The ST_MAKELINE function using start and end point of the segment is used to create a line for each segment in the travel segments data 142.

Figure 3A:
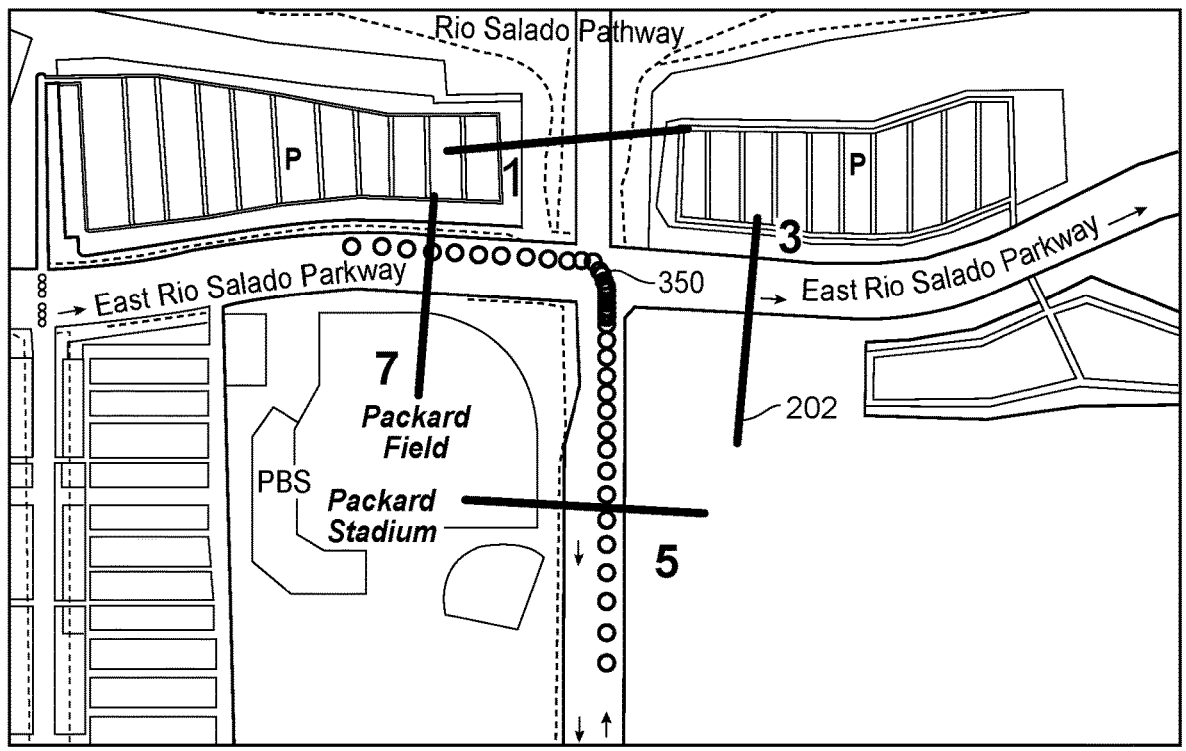
FIG. 3A is a diagram of an example set of points representing a traversal through an intersection.
Figure 3B:
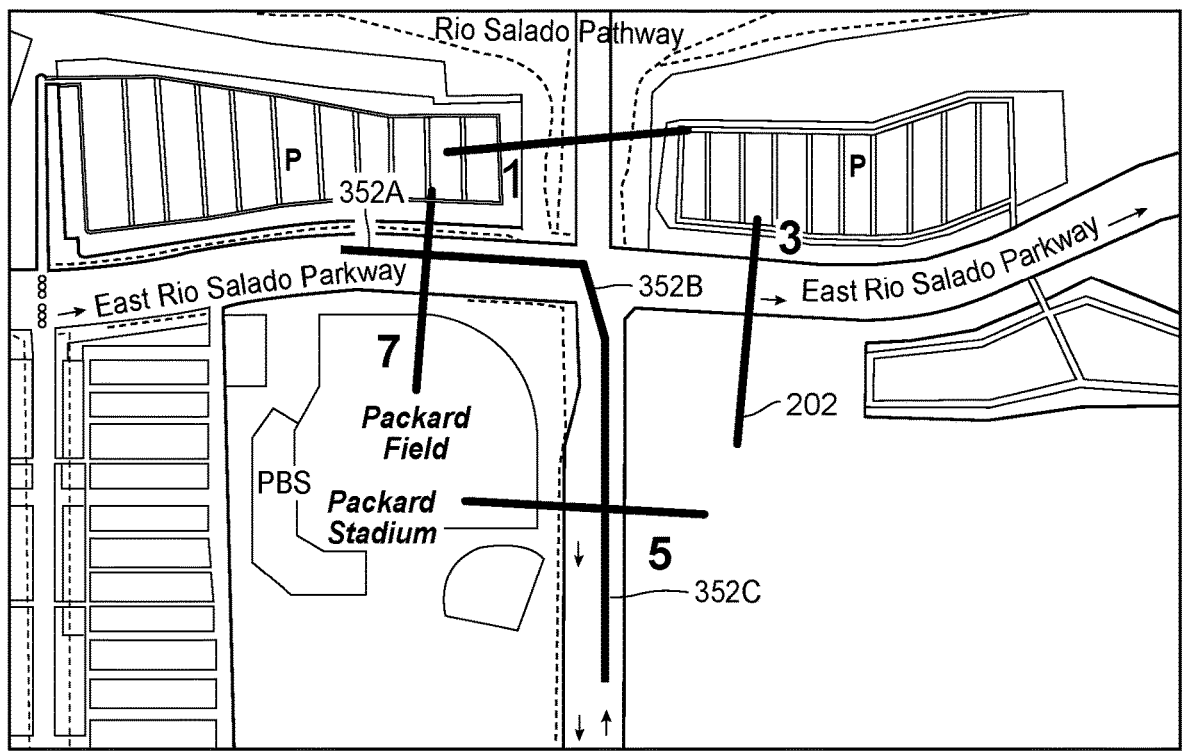
FIG. 3B is a diagram of an example simplified set of simplified, straight-line segments representing a traversal through an intersection.

For example, FIG. 3A illustrates an example set of points 350 of the telematics data 102 representing a traversal through virtual lines 202 assigned ordinals (7,5) associated with an intersection. In contrast, FIG. 3B illustrates examples of simplified straight-line segments 352A, 352B, 352C illustrating the same traversal through virtual lines 202 assigned ordinals (7,5) associated with the intersection, i.e., after the points 350 of the telematics data 102 are converted using the ST_SIMPLIFY function.

Returning to FIG. 1, the segmentation module 140 adds the points at the ends of the travel segments of the travel segments data 142 back to the telematics data 102 to form modified location data 144 that is stored in a compressed telematics database 146. In some examples, the segmentation module 140 adds acceleration information to the modified location data 144.

To identify intersection traversals, the telematics compressor 118 includes an intersection traversal detection module 148. The intersection traversal detection module 148 may be a portion of a memory unit (e.g., the program memory 802 of FIG. 8) configured to store software, and machine- or computer-readable instructions that, when executed by a processing unit (e.g., the processor 804 of FIG. 8), cause the intersection traversal detection module 148 to, based on the intersection data 138 and the travel segments data 142 (i.e., based on the simplified straight-line segments), identify traversals of intersections, and store the pair of ordinals 150 representing each traversal in the compressed telematics database 146. In an example implemented using PostGIS, the intersection traversal detection module 148 identifies traversals of intersections using the virtual lines 202 described above and located within 146 feet of an intersection using the ST_DWITHIN function. The subset of telematics data 102 of the intersecting simplified lines is determined by joining the intersecting simplified segment lines to the full telematics data using the vehicle device code, the trip code, the simplified segment code and the telematics time range associated with the simplified line segment. The subset of telematics data points within a radius of 182 feet of the intersection (determined by the ST_DWITHIN function) are combined into a line using the ST_MAKELINE function ordered by the recording time of the telematics data point. The intersections of this line and the virtual lines 202 are determined using the ST_INTERSECTION function. That is, the simplified line and vector line table are joined to find the intersecting points and vector code using the ST_INTERSECTION function. The linear fractions are grouped into intersection crossings, which are determined per spatial gap in the linear fractions. Each intersection crossing is assigned an intersection trip ID for each trip, as a vehicle can drive through an intersection more than once in a single trip. The order of vector codes determines the direction of each intersection crossing. The sequence of intersections is determined by using the ST_LINELOCATEPOINT function on the intersections of the GPS point subset line to the virtual lines which determines which ordinal values are assigned first and second. A CASE statement with each combination of turn based on first and second ordinal values is used to determine the direction of the turn. Incomplete or invalid traversals are identified and flagged. For example, a car might drive through a gas station and cross only one virtual line 202 resulting in an incomplete traversal. Or a car could perform a U turn in an intersection and cross the same virtual line 202 twice which would also be flagged as invalid.

Moreover, in some examples, the combination of ordinals may be converted into a turn code. For instance, each of the 56 possible turns of the eight ordinal combinations may each have a different turn code. Trips can be filtered per turn code to isolate only certain turns for detailed analysis. For example, a certain left turn in a particular intersection may have a higher rate of collision than other turns at that intersection, or than other turns at other intersections.

A telematics analysis module 152, which may be a portion of a memory unit (e.g., the program memory 802 of FIG. 8) configured to store software, and machine- or computer-readable instructions that, when executed by a processing unit (e.g., the processor 804 of FIG. 8), cause the telematics analysis module 152 to perform telematics analytics. For example, to identify all traversals of an intersection from road A to road B, a user can request that a search be performed for all traversals associated with a pair of ordinals (C, D) for the intersection, where the ordinal C is associated with a virtual line crossing the road A, and the ordinal D is associated with a virtual line crossing the road B. Such a search is both easier to define, and faster to perform than having to trace travel paths through an intersection. Such searches could additionally or alternatively, return the time spent in the intersection, speed through the intersection, etc. Searches for trips on a stretch of road can be performed by searching the road segment data 142 created by the segmentation module 140 for certain road ID numbers. The simplified segments with the targeted road segment IDs are joined to the telematics data for analysis.

While not shown for clarity of illustration, the telematics system 100 of FIG. 1 may include various hardware components (e.g., a processor such as the processor 804 of FIG. 8) that may execute software, and machine- or computer readable instructions to capture and compress telematics data. The telematics system 100 also includes data communication components for communicating between devices. Further, one or more of the elements, processes and devices illustrated in FIG. 1 may be combined, divided, re-arranged, omitted, eliminated or implemented in any other way. Further, the telematics system 100 may include one or more elements, processes or devices in addition to, or instead of, those illustrated in FIG. 1, or may include more than one of any or all of the illustrated elements, processes and devices.

Figure 4:
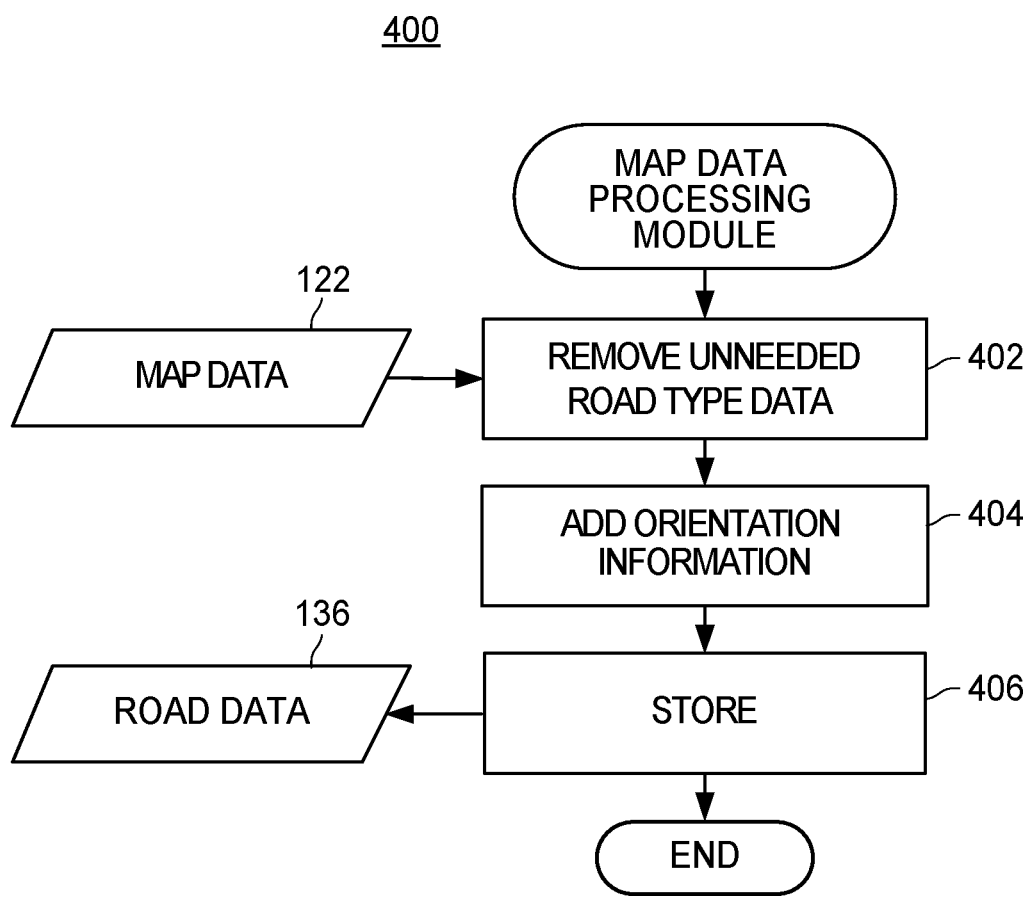
FIG. 4 is a flowchart representative of example method, hardware logic and instructions for implementing the road data processing module of FIG. 1.

A flowchart 400 representative of example processes, methods, software, firmware, and computer- or machine-readable instructions for implementing the road data processing module 132 is shown in FIG. 4. The processes, methods, software, and machine-readable or computer-readable instructions may be an executable program or portion of an executable program for execution by a processor such as the processor 804 of FIG. 8. The program may be embodied in software or instructions stored on a non-transitory computer- or machine-readable storage medium or disk associated with the processor 804. Further, although the example program is described with reference to the flowchart illustrated in FIG. 4, many other methods of implementing the example road data processing module 132 may alternatively be used. For example, the order of execution of the blocks may be changed, and/or some of the blocks described may be changed, eliminated, or combined. Additionally, or alternatively, any or all of the blocks may be implemented by one or more hardware circuits (e.g., discrete and/or integrated analog and/or digital circuitry, an application specific integrated circuit (ASIC), a programmable logic device (PLD), a field programmable gate array (FPGA), a field programmable logic device (FPLD), a logic circuit, etc.) structured to perform the corresponding operation without executing software or firmware.

The example process of FIG. 4 begins with the road data processing module 132 removing roads that are not needed (e.g., have road type(s) that are not of interest such as parking lots) from the map data 122 (block 402). The road data processing module 132 adds orientation information, speed information, etc. to roads to form road data 136 (block 404), and stores the road data 136 (block 406). Control then exits from the example process of FIG. 4.

Figure 5:
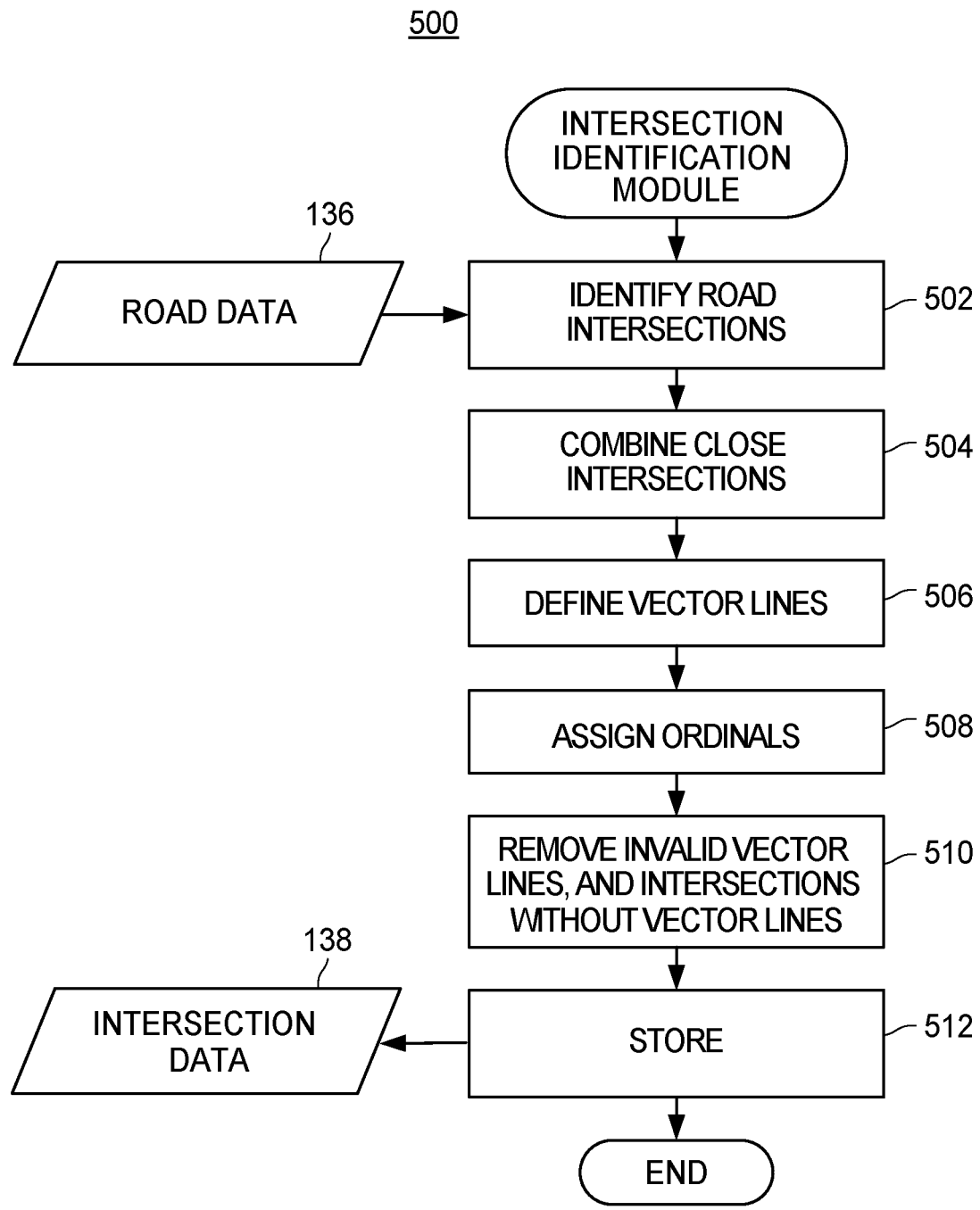
FIG. 5 is a flowchart representative of example method, hardware logic and instructions for implementing the intersection identification module of FIG. 1.

A flowchart 500 representative of example processes, methods, software, firmware, and computer- or machine-readable instructions for implementing the intersection identification module 134 is shown in FIG. 5. The processes, methods, software and instructions may be an executable program or portion of an executable program for execution by a processor such as the processor 804 of FIG. 8. The program may be embodied in software or instructions stored on a non-transitory computer- or machine-readable storage medium or disk associated with the processor 804. Further, although the example program is described with reference to the flowchart illustrated in FIG. 5, many other methods of implementing the example intersection identification module 134 may alternatively be used. For example, the order of execution of the blocks may be changed, and/or some of the blocks described may be changed, eliminated, or combined. Additionally, or alternatively, any or all of the blocks may be implemented by one or more hardware circuits (e.g., discrete and/or integrated analog and/or digital circuitry, an ASIC, a PLD, an FPGA, an FPLD, a logic circuit, etc.) structured to perform the corresponding operation without executing software or firmware.

The example process of FIG. 5 begins with the intersection identification module 134 identifying physical intersections of the roads specified in the map database 126 based on the roads defined in the road data 136 (block 502), and combining nearby intersections (block 504). In an example implemented using PostGIS, the ST_INTERSECTION function is used to identify intersections, and the ST_CLUSTERDBSCAN function is used to identify nearby intersections. In some examples, the map database 126 includes information regarding intersections. In such examples, the intersection identification module 134 need not identify intersections. Additionally or alternatively, the intersection identification module 134 may enhance intersection data with custom values such as risk classifications or crash counts derived, for example, by an operator or owner of the telematics compressor 118. For each (combined) intersection, the intersection identification module 134 identifies a plurality of virtual lines angularly spaced about the intersection (block 506), and assigns ordinals to the remaining vector lines (block 508).

The intersection identification module 134 removes ones of the virtual lines that do not cross a road (block 508). In an example implemented using PostGIS, the virtual lines 202 for each intersection 206 are created by generating a circle (of line type) of fixed radius from the road intersection point 206 that intersects the road line segments 208, 212. To create the circle line, the ST_EXTERIORRING function converts the solid circle shape created by the ST_BUFFER function into a circular line. The ST_BUFFER function uses the road intersection point 206 with a buffer parameter of 80 feet. The intersection of the circle and a road 208, 212 is the midpoint of the virtual line 202. The circle-road intersection points are determined by using the ST_INTERSECTION function on the line circle and road segment definitions. The virtual line 202 is perpendicular to the road line segment 208, 212 at the point of intersection of the road line with the circle. The ST_OFFSETCURVE function is used to create two points perpendicular to angle of the road 208, 212 at the intersection of the road segment and line circle. The ST_MAKELINE function creates the virtual line 202 by using the points created by ST_OFFSETCURVE as the start and endpoints of the line, and stores the intersection data 138 (e.g., information, etc.) representing the identified (combined) intersections, their virtual lines, and the ordinals assigned to the remaining virtual lines for subsequent recall (block 512). In some examples, the road data 136 includes speed limit information that can be used to determine whether a vehicle turned from a side street or parking lot onto a busy street, or vice versa. Such speed limit information may be useful in determining driving behavior for different types of intersections. Speed limit ordinals could be included as another ordinal value per virtual line 214. Additional, or alternatively, ordinal values can be assigned for other road characteristics such as stop signs, stop lights, etc. These additional intersection ordinal value pairs and turn direction ordinal values can be analyzed individually or together on a city wide scale as described for turn direction ordinal values. For example, a trip through an intersection can have directional pair of ordinals (3, 1), and a road speed pair of ordinals (8, 6) indicating a right turn from a side street to a busy street. Control then exits from the example process of FIG. 5.

Figure 6:
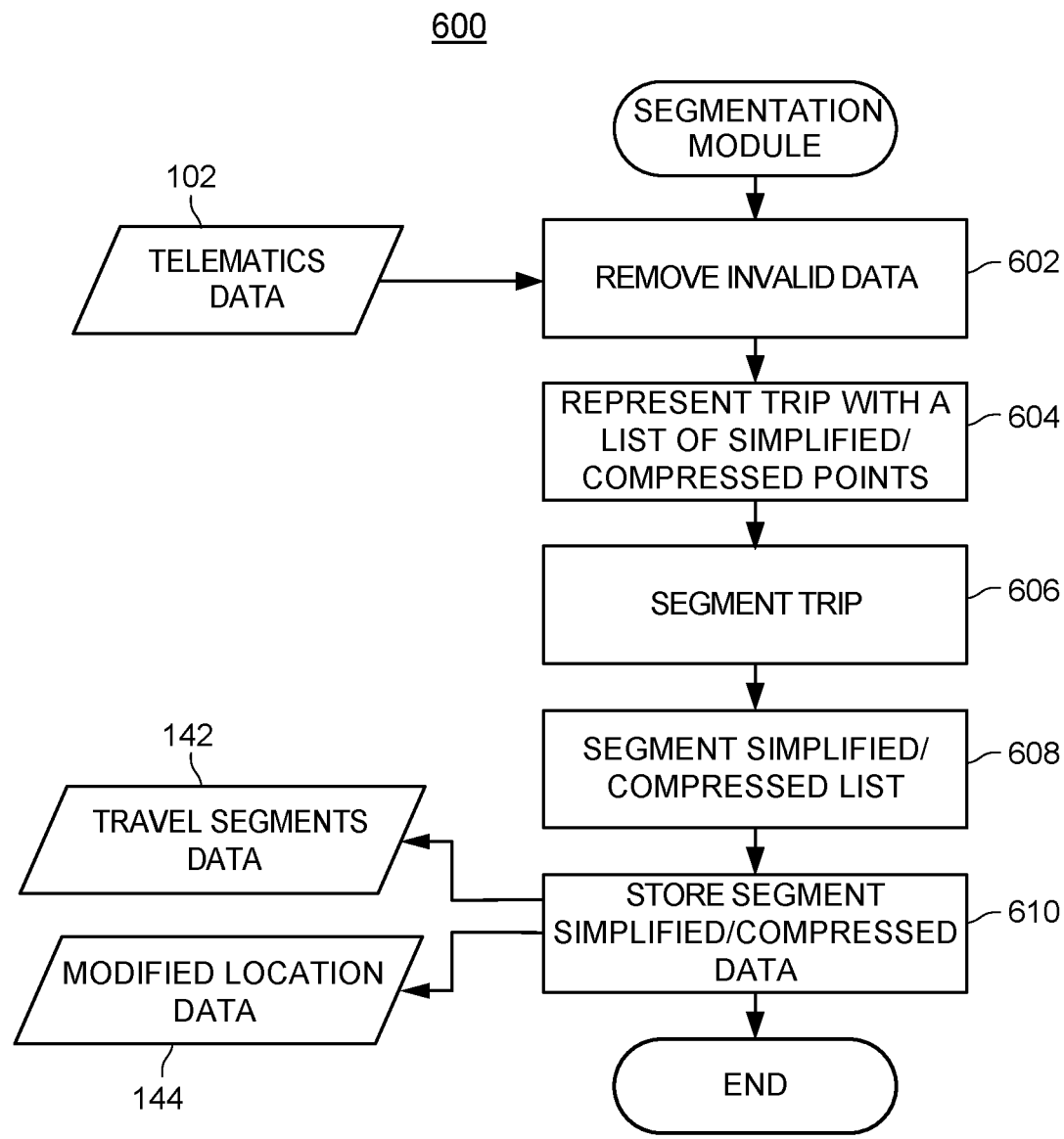
FIG. 6 is a flowchart representative of example method, hardware logic and instructions for implementing the segmentation module of FIG. 1.

A flowchart 600 representative of example processes, methods, software, firmware, and computer- or machine-readable instructions for implementing the segmentation module 140 is shown in FIG. 6. The processes, methods, software and instructions may be an executable program or portion of an executable program for execution by a processor such as the processor 804 of FIG. 8. The program may be embodied in software or instructions stored on a non-transitory computer- or machine-readable storage medium or disk associated with the processor 804. Further, although the example program is described with reference to the flowchart illustrated in FIG. 6, many other methods of implementing the example segmentation module 140 may alternatively be used. For example, the order of execution of the blocks may be changed, and/or some of the blocks described may be changed, eliminated, or combined. Additionally, or alternatively, any or all of the blocks may be implemented by one or more hardware circuits (e.g., discrete and/or integrated analog and/or digital circuitry, an ASIC, a PLD, an FPGA, an FPLD, a logic circuit, etc.) structured to perform the corresponding operation without executing software or firmware.

The example process of FIG. 6 begins with the segmentation module 140 removing invalid (e.g., incomplete, incorrect, blank, etc.) data from the telematics data 102 (block 602). The segmentation module 140 creates a line of points that represents a trip in the telematics data 102 (block 604). The segmentation module 140 forms travel segment data 142 by splitting (e.g., segmenting, etc.) the telematics data 102 into segments based on the line of points (block 606). In an example implemented using PostGIS, the ST_SIMPLIFY function of PostGIS is used to segment the telematics data 102 into the travel segments data 142, and the ST_DISTANCE function is used to find the road segment that is closest to points of the telematics data 102 (or ST_DWITHIN to find roads within a certain distance). The ST_MAKELINE function is used to create a line from the telematics data 102 using an M coordinate value of the timestamps of the telematics data 102. The ST_SIMPLIFY function converts this line into a simplified line using an implementation of the Douglas-Peuker algorithm with a tolerance of 0.00005. The simplified line is divided into simplified straight-line segments using the ST_POINTN function for each point in the simplified line. The M coordinates are used as the start and end range of each segment which is joined to the telematics data 102 in the segmentation module 140 (block 610). The ST_MAKELINE function using start and end point of the segment is used to create a line for each segment in the travel segments data 142 (block 608). The segmentation module 140 stores the travel segment data 142 and the modified location data 144 in the compressed telematics database 146 (block 610). In some examples, the segmentation module 140 adds acceleration information to the modified location data 144. Control then exits from the example process of FIG. 7.

Figure 7:
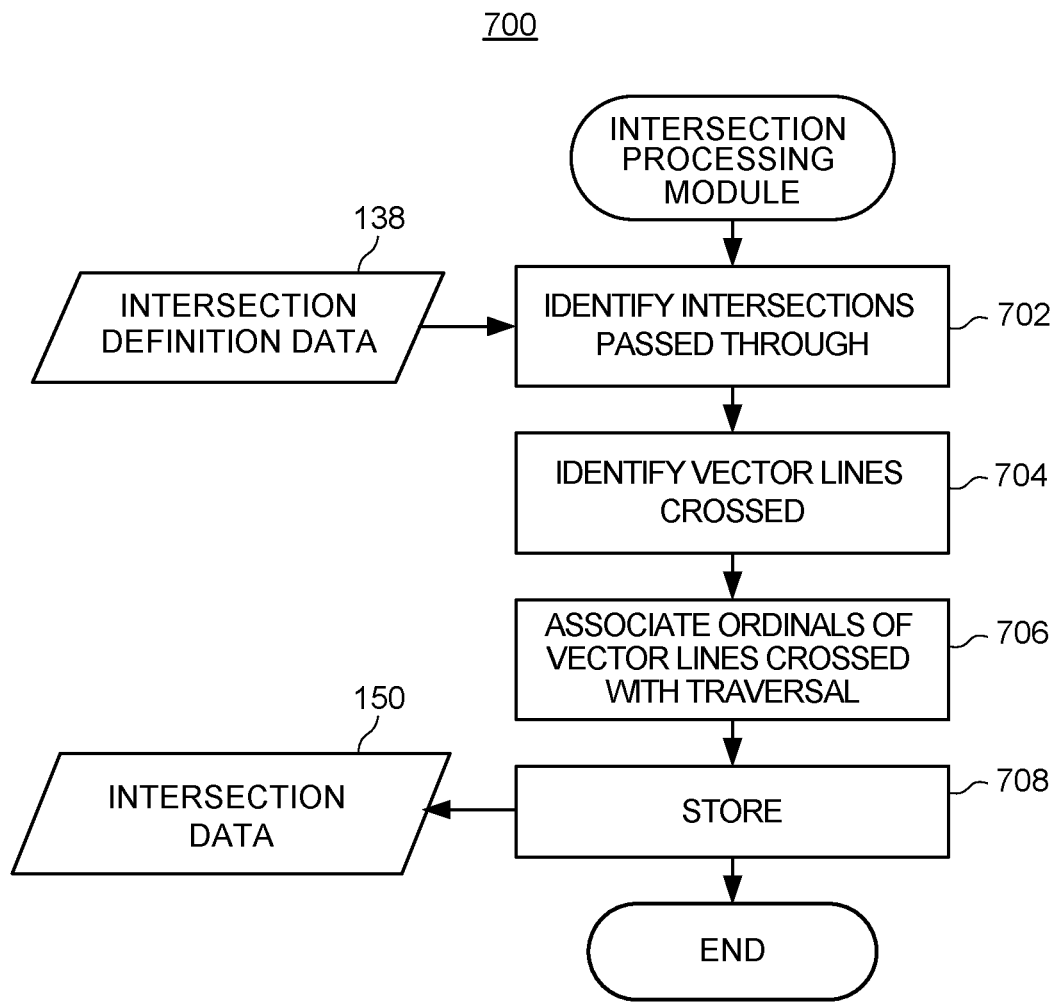
FIG. 7 is a flowchart representative of example method, hardware logic or instructions for implementing the intersection processing module of FIG. 1.

A flowchart 700 representative of example processes, methods, software, firmware, and computer- or machine-readable instructions for implementing the intersection traversal detection module 148 is shown in FIG. 7. The processes, methods, software and instructions may be an executable program or portion of an executable program for execution by a processor such as the processor 804 of FIG. 8. The program may be embodied in software or instructions stored on a non-transitory computer- or machine-readable storage medium or disk associated with the processor 804. Further, although the example program is described with reference to the flowchart illustrated in FIG. 7, many other methods of implementing the example intersection traversal detection module 148 may alternatively be used. For example, the order of execution of the blocks may be changed, and/or some of the blocks described may be changed, eliminated, or combined. Additionally, or alternatively, any or all of the blocks may be implemented by one or more hardware circuits (e.g., discrete and/or integrated analog and/or digital circuitry, an ASIC, a PLD, an FPGA, an FPLD, a logic circuit, etc.) structured to perform the corresponding operation without executing software or firmware.

The example process of FIG. 7 begins with the intersection processing module 148 identifying intersection traversals (block 702). For each intersection traversal, the intersection traversal detection module 148 identifies the virtual lines crossed (block 704) by the simplified straight-line segments, and associates the traversal with a pair of ordinals 150 representing the virtual lines crossed (block 706). In an example implemented using PostGIS, simplified lines within 146 feet of an intersection are located using the ST_DWITHIN function. The subset of telematics data 102 of the intersecting simplified lines is determined by joining the intersecting simplified segment lines to the full telematics data 102 using the vehicle device code, the trip code, the simplified segment code and the telematics time range associated with the simplified line segment. The subset of telematics data points within a radius of 182 feet of the intersection (determined by the ST_DWITHIN function) are combined into a line using the ST_MAKELINE function ordered by the recording time of the telematics data point (block 702). The intersections of this line and the virtual lines 202 are determined using the ST_INTERSECTION function (block 704). The sequence of intersections is determined by using the ST_LINELOCATEPOINT function on the intersections of the GPS point subset line to the virtual lines which determines which ordinal values are assigned first and second (block 706). A CASE statement with each combination of turn based on first and second ordinal values is used to determine the direction of the turn. Incomplete or invalid traversals are identified and flagged. For example, a car might drive through a gas station and cross only one virtual line 202 resulting in an incomplete traversal. Or a car could perform a U turn in an intersection and cross the same virtual line 202 twice which would also be flagged as invalid. The intersection traversal detection module 148 stores pairs of ordinals 150 in the compressed telematics database 146 (block 708). Control then exits from the example process of FIG. 7.

Figure 8:
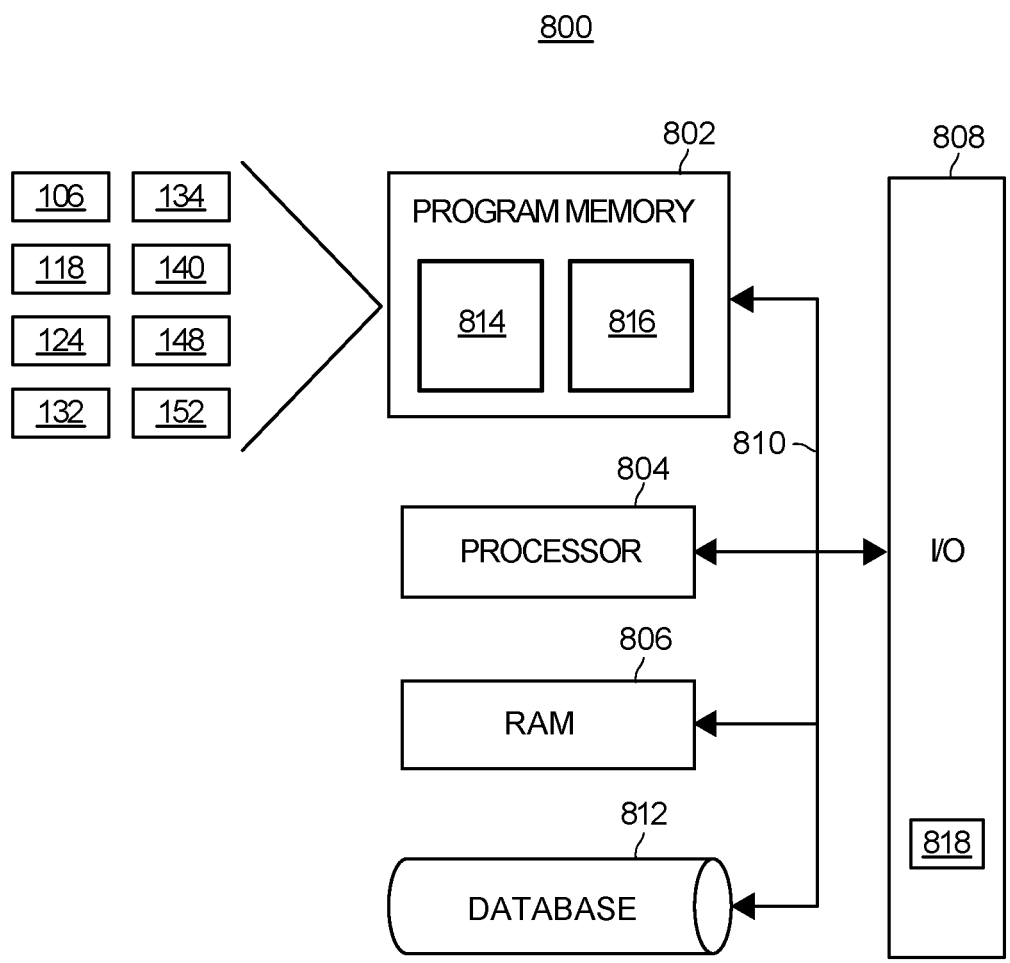
FIG. 8 is a block diagram of an example computing system that may be used to carry out the example processes of FIGS. 4-7 to capture and compress telematics data, in accordance with the described embodiments.

Referring now to FIG. 8, a block diagram of an example computing system 800 to capture and compress telematics data in accordance with described embodiments is shown. The example computing system 800 may be used to, for example, implement the GPS receiver 106, the mobile device 116, the telematics compressor 118, the data collection module 124, the road data processing module 132, the intersection identification module 134, the segmentation module 140, the intersection traversal detection module 148, and the telematics analysis module 152.

The computing system 800 includes a program memory 802, a processor 804, a RAM 806, and an I/O circuit 808, all of which are interconnected via an address/data bus 810. The program memory 802 may store software, and machine- or computer-readable instructions, which may be executed by the processor 804.

It should be appreciated that although FIG. 8 depicts only one processor 804, the computing system 800 may include multiple processors 802. Example processors 802 include a programmable processor, a programmable controller, a graphics processing unit (GPU), a digital signal processor (DSP), an ASIC, a PLD, an FPGA, an FPLD, etc.

Similarly, the program memory 802 may include memories, for example, one or more RAMs (e.g., a RAM 814) or one or more program memories (e.g., a ROM 816), or a cache (not shown) storing one or more corresponding software, and machine- or computer-instructions. For example, the program memory 802 stores software, and machine- or computer-readable instructions, or computer-executable instructions that may be executed by the processor 804 to implement the GPS receiver 106, the mobile device 116, the telematics compressor 118, the data collection module 124, the road data processing module 132, the intersection identification module 134, the segmentation module 140, the intersection traversal detection module 148, and the telematics analysis module 152 to capture and compress telematics data. The software, machine-readable instructions, or computer-executable instructions that may be stored on separate non-transitory computer- or machine-readable storage mediums or disks, or at different physical locations.

In some embodiments, the processor 804 may also include, or otherwise be communicatively connected to, a database 812 or other data storage mechanism (one or more hard disk drives, optical storage drives, solid state storage devices, CDs, CD-ROMs, DVDs, Blu-ray disks, etc.). In some examples, the database 812 stores the telematics data 102, data stored on the disk 108, the map data 122, the map database 126, the road data 136, the intersection data 138, the travel segments data 142, the modified location data 144, and the compressed telematics database 146.

Although FIG. 8 depicts the I/O circuit 808 as a single block, the I/O circuit 808 may include a number of different types of I/O circuits or components that enable the processor 804 to communicate with peripheral I/O devices. The peripheral I/O devices may be any desired type of I/O device such as a keyboard, a display (a liquid crystal display (LCD), a cathode ray tube (CRT) display, touch, etc.), a navigation device (a mouse, a trackball, a capacitive touch pad, a joystick, etc.), speaker, a microphone, a button, a communication interface, an antenna, etc.

The I/O circuit 808 may include a number of different network transceivers 818 that enable the computing system 800 to communicate with another computer system via, e.g., a network. The network transceiver 818 may be a Wi-Fi transceiver, a Bluetooth transceiver, an infrared transceiver, a cellular transceiver, an Ethernet network transceiver, an asynchronous transfer mode (ATM) network transceiver, a digital subscriber line (DSL) modem, a cable modem, etc.

The program memory 802, the RAM(s) 806, 814 and the ROM(s) 816 may be implemented in any known form of volatile or non-volatile computer storage media, including but not limited to, semiconductor memories, magnetically readable memories, and/or optically readable memories, for example, but does not include carrier waves.

From the foregoing, it will be appreciated that example methods, apparatus and articles of manufacture have been disclosed that capture and compress telematics data. From the foregoing, it will be appreciated that methods, apparatus and articles of manufacture have been disclosed that enhance the operations of a computer to reduce the amount of storage needed to store telematics data, and that enable more efficient and complete querying of telematics data. The disclosed methods, apparatus and articles of manufacture improve the efficiency of using a computing device by compressing telematics data and representing compressed telematics data in a way that telematics data can be obtained for a large geographic region. That is, through the use of these processes, computers can operate more efficiently by relatively quickly compressing telematics data. The disclosed methods, apparatus and articles of manufacture are accordingly directed to one or more improvement(s) in the functioning of a computer.

Example methods, apparatus, and articles of manufacture to capture and compress telematics data are disclosed herein. Further examples and combinations thereof include at least the following.

Example 1 is a computer-implemented method, executed by a processor, to represent telematics data that includes: receiving, with the processor, telematics data including a series of points representing a trip; segmenting, with the processor, the telematics data into a series of travel segments representing the trip using simplified straight lines; identifying, with the processor, a physical intersection of roads; identifying, with the processor, virtual lines crossing the roads; assigning, with the processor, ordinals to the virtual lines; representing, with the processor, a physical traversal through the physical intersection captured in first telematics data by a pair of the ordinals determined based on the series of travel segments representing the trip using simplified straight lines; and storing the pair of the ordinals in second compressed telematics data.

Example 2 is the method of example 1, further comprising: identifying travel segments in the first telematics data; and storing the travel segments in the second compressed telematics data.

Example 3 is the method of example 2, further comprising: identifying, with the processor, road segments for roads specified in a map database; and correlating, with the processor, the travel segments and the road segments to identify which road segments were physically traversed.

Example 4 is the method of any of examples 1 to 3, further comprising, in response to a request, searching, with the processor, based on the pair of the ordinals in the second compressed telematics data to identify physical traversals through the physical intersection from a first road to a second road in the first telematics data, the pair of the ordinals including a first ordinal associated with the first road and a second ordinal associated with the second road.

Example 5 is the method of any of examples 1 to 4, wherein identifying the virtual lines includes: defining, with the processor, a plurality of virtual lines that are angularly spaced about the physical intersection; and excluding, with the processor, virtual lines that are not crossed by a road from the plurality of virtual lines.

Example 6 is the method of example 5, wherein eight virtual lines are defined and angularly spaced to form an octagonal shape.

Example 7 is the method of any of examples 1 to 6, wherein the physical intersection is identified, by the processor, based on roads specified in a map database.

Example 8 is the method of example 7, wherein the map database is accessed, by the processor, from a map data vendor.

Example 9 is the method of any of examples 1 to 8, wherein the first telematics data is accessed from a vehicle, and includes geospatial driving data captured for the vehicle while the vehicle is operated.

Example 10 is the method of any of examples 1 to 9, wherein the virtual lines are identified, by the processor, to be a predefined distance from the physical intersection.

Example 11 is the method of any of claims 1 to 10, further comprising: identifying, with the processor, a plurality of physical intersections of roads; and combining, with the processor, a first physical intersection of the plurality of physical intersections and a second physical intersection of the plurality of physical intersections when a distance between the first physical intersection and the second physical intersection satisfies a criteria.

Example 12 is a non-transitory computer-readable storage medium comprising instructions that, when executed, cause a machine to: receive telematics data including a series of points representing a trip; segment the telematics data into a series of travel segments representing the trip using simplified straight lines; identify a physical intersection of roads; identify virtual lines crossing the roads; assign ordinals to the virtual lines; represent a physical traversal through the physical intersection captured in first telematics data by a pair of the ordinals determined based on the series of travel segments representing the trip using simplified straight lines; and store the pair of the ordinals in second compressed telematics data.

Example 13 is the non-transitory computer-readable storage medium of example 12, including further instructions that, when executed, cause the machine to: identify travel segments in the first telematics data; and store the travel segments in the second compressed telematics data.

Example 14 is the non-transitory computer-readable storage medium of example 13, including further instructions that, when executed, cause the machine to: identify road segments for roads specified in a map database; and correlate the travel segments and the road segments to identify which road segments were physically traversed.

Example 15 is the non-transitory computer-readable storage medium of any of examples 12 to 14, including further instructions that, when executed, cause the machine to, in response to a request, search based on the pair of the ordinals in the second compressed telematics data to identify physical traversals through the physical intersection from a first road to a second road in the first telematics data, the pair of the ordinals including a first ordinal associated with the first road and a second ordinal associated with the second road.

Example 16 is the non-transitory computer-readable storage medium of any of examples 12 to 15, including further instructions that, when executed, cause the machine to identify the virtual lines by: defining a plurality of virtual lines that are angularly spaced about the physical intersection; and excluding virtual lines that are not crossed by a road from the plurality of virtual lines.

Example 17 is the non-transitory computer-readable storage medium of any of examples 12 to 16, including further instructions that, when executed, cause the machine to define the virtual lines a predefined distance from the physical intersection.

Example 18 is the non-transitory computer-readable storage medium of any of examples 12 to 17, wherein the physical intersection is identified based on roads specified in a map database.

Example 19 is the non-transitory computer-readable storage medium of any of examples 12 to 18, wherein the first telematics data is accessed from a vehicle, and includes geospatial driving data captured for the vehicle while the vehicle is operated.

Example 20 is the non-transitory computer-readable storage medium of any of examples 12 to 19, including further instructions that, when executed, cause the machine to: identify a plurality of physical intersections of roads; and combine a first physical intersection of the plurality of physical intersections and a second physical intersection of the plurality of physical intersections when a distance between the first physical intersection and the second physical intersection satisfies a criteria.

As used herein, the terms "comprises," "comprising," "includes," "including," "has," "having" or any other variation thereof, are intended to cover a non-exclusive inclusion. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended.

Further, unless expressly stated to the contrary, "or" refers to an inclusive or and not to an exclusive or. For example, A, B or C refers to any combination or subset of A, B, C such as (1) A alone, (2) B alone, (3) C alone, (4) A with B, (5) A with C, (6) B with C, and (7) A with B and with C. As used herein, the phrase "at least one of A and B" is intended to refer to implementations including any of (1) at least one A, (2) at least one B, and (3) at least one A and at least one B. Similarly, the phrase "at least one of A or B" is intended to refer to implementations including any of (1) at least one A, (2) at least one B, and (3) at least one A and at least one B.

As used herein, the expressions "in communication," "coupled" and "connected, including variations thereof," encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, the term non-transitory computer-readable medium is expressly defined to include any type of computer-readable storage device and/or storage disk and to exclude propagating signals and to exclude transmission media. As used herein, the term non-transitory machine-readable medium is expressly defined to include any type of machine-readable storage device and/or storage disk and to exclude propagating signals and to exclude transmission media.

Any references, including publications, patent applications, and patents cited herein are hereby incorporated in their entirety by reference to the same extent as if each reference were individually and specifically indicated to be incorporated by reference and were set forth in its entirety herein.

Finally, unless a claim element is defined by reciting the word "means" and a function without the recital of any structure, it is not intended that the scope of any claim element be interpreted based on the application of 35 U.S.C. § 112, sixth paragraph.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A computer-implemented method, executed by a processor, to represent telematics data, the method comprising:
   receiving, with the processor, telematics data including a series of points representing a trip;
   generating, with the processor, a series of travel segments representing the trip using simplified straight lines based on the telematics data;
   identifying, with the processor, a physical intersection of roads;
   identifying, with the processor, virtual lines crossing the roads;
   assigning, with the processor, ordinals to the virtual lines;
   representing, with the processor, a physical traversal through the physical intersection captured in first telematics data by a pair of the ordinals determined based on the series of travel segments representing the trip using simplified straight lines; and
   storing the pair of the ordinals in second compressed telematics data.

2. The method of claim 1, further comprising:
   identifying travel segments in the first telematics data; and
   storing the travel segments in the second compressed telematics data.

3. The method of claim 2, further comprising:
   identifying, with the processor, road segments for roads specified in a map database; and correlating, with the processor, the travel segments and the road segments to identify which road segments were physically traversed.

4. The method of claim 1, further comprising, in response to a request, searching, with the processor, based on the pair of the ordinals in the second compressed telematics data to identify physical traversals through the physical intersection from a first road to a second road in the first telematics data, the pair of the ordinals including a first ordinal associated with the first road and a second ordinal associated with the second road.

5. The method of claim 1, wherein identifying the virtual lines includes:
  defining, with the processor, a plurality of virtual lines that are angularly spaced about the physical intersection; and
  excluding, with the processor, virtual lines that are not crossed by a road from the plurality of virtual lines.

6. The method of claim 5, wherein eight virtual lines are defined and angularly spaced to form an octagonal shape.

7. The method of claim 1, wherein the physical intersection is identified, by the processor, based on roads specified in a map database.

8. The method of claim 7, wherein the map database is accessed, by the processor, from a map data vendor.

9. The method of claim 1, wherein the first telematics data is accessed from a vehicle, and includes geospatial driving data captured for the vehicle while the vehicle is operated.

10. The method of claim 1, wherein the virtual lines are identified, by the processor, to be a predefined distance from the physical intersection.

11. The method of claim 1, further comprising:
  identifying, with the processor, a plurality of physical intersections of roads; and
  combining, with the processor, a first physical intersection of the plurality of physical intersections and a second physical intersection of the plurality of physical intersections when a distance between the first physical intersection and the second physical intersection satisfies a criteria.

12. A non-transitory computer-readable storage medium comprising instructions that, when executed, cause a machine to:
  receive telematics data including a series of points representing a trip;
  generate a series of travel segments representing the trip using simplified straight lines based on the telematics data;
  identify a physical intersection of roads;
  identify virtual lines crossing the roads;
  assign ordinals to the virtual lines;
  represent a physical traversal through the physical intersection captured in first telematics data by a pair of the ordinals determined based on the series of travel segments representing the trip using simplified straight lines; and
  store the pair of the ordinals in second compressed telematics data.

13. The non-transitory computer-readable storage medium of claim 12, including further instructions that, when executed, cause the machine to:
  identify travel segments in the first telematics data; and
  store the travel segments in the second compressed telematics data.

14. The non-transitory computer-readable storage medium of claim 13, including further instructions that, when executed, cause the machine to:
  identify road segments for roads specified in a map database; and
  correlate the travel segments and the road segments to identify which road segments were physically traversed.

15. The non-transitory computer-readable storage medium of claim 12, including further instructions that, when executed, cause the machine to, in response to a request, search based on the pair of the ordinals in the second compressed telematics data to identify physical traversals through the physical intersection from a first road to a second road in the first telematics data, the pair of the ordinals including a first ordinal associated with the first road and a second ordinal associated with the second road.

16. The non-transitory computer-readable storage medium of claim 12, including further instructions that, when executed, cause the machine to identify the virtual lines by:
  defining a plurality of virtual lines that are angularly spaced about the physical intersection; and
  excluding virtual lines that are not crossed by a road from the plurality of virtual lines.

17. The non-transitory computer-readable storage medium of claim 12, including further instructions that, when executed, cause the machine to define the virtual lines a predefined distance from the physical intersection.

18. The non-transitory computer-readable storage medium of claim 12, wherein the physical intersection is identified based on roads specified in a map database.

19. The non-transitory computer-readable storage medium of claim 12, wherein the first telematics data is accessed from a vehicle, and includes geospatial driving data captured for the vehicle while the vehicle is operated.

20. The non-transitory computer-readable storage medium of claim 12, including further instructions that, when executed, cause the machine to:
  identify a plurality of physical intersections of roads; and
  combine a first physical intersection of the plurality of physical intersections and a second physical intersection of the plurality of physical intersections when a distance between the first physical intersection and the second physical intersection satisfies a criteria.

\* \* \* \* \*